US 8,254,148 B2

(12) United States Patent
Hsiao et al.

(10) Patent No.: US 8,254,148 B2
(45) Date of Patent: Aug. 28, 2012

(54) SYSTEM AND MOUNTING APPARATUS FOR ELECTRONIC DEVICE WITH CABLE SECURING COMPONENTS

(75) Inventors: Yi-Liang Hsiao, Taipei Hsien (TW); Hsueh-Chin Lu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 226 days.

(21) Appl. No.: 12/768,711

(22) Filed: Apr. 27, 2010

(65) Prior Publication Data

US 2011/0235305 A1 Sep. 29, 2011

(30) Foreign Application Priority Data

Mar. 29, 2010 (TW) ................................ 99109286 A

(51) Int. Cl.
*H02B 1/20* (2006.01)
(52) U.S. Cl. ..................... 361/826; 361/825; 361/802
(58) Field of Classification Search .............. 361/756, 361/788, 727–730, 732, 752, 796, 800–803, 361/825–826; 439/527; 248/65, 74.1
See application file for complete search history.

(56) References Cited

U.S. PATENT DOCUMENTS

| | | | | | |
|---|---|---|---|---|---|
| 4,679,123 | A | * | 7/1987 | Young | 361/827 |
| 5,586,012 | A | * | 12/1996 | Lerman | 361/826 |
| 5,788,087 | A | * | 8/1998 | Orlando | 211/26 |
| 6,170,784 | B1 | * | 1/2001 | MacDonald et al. | 248/65 |
| 6,629,675 | B1 | * | 10/2003 | Bjorklund et al. | 248/49 |
| 7,087,840 | B2 | * | 8/2006 | Herring et al. | 174/101 |
| 7,462,779 | B2 | * | 12/2008 | Caveney et al. | 174/68.1 |
| 7,778,513 | B2 | * | 8/2010 | Rinderer et al. | 385/134 |
| 7,952,023 | B2 | * | 5/2011 | Caveney et al. | 174/68.1 |
| 8,040,693 | B2 | * | 10/2011 | Blomquist | 361/826 |
| 8,061,534 | B2 | * | 11/2011 | Laursen et al. | 211/26 |

* cited by examiner

*Primary Examiner* — Hung S Bui
(74) *Attorney, Agent, or Firm* — Altis Law Group, Inc.

(57) ABSTRACT

A system includes a mounting rack and an electronic device. The mounting rack includes a frame and a plurality of supports located at the back of the frame. A plurality of cable securing components is located in the frame. The electronic device is inserted in the mounting rack from front to back and includes a front wall. The front wall is adjacent to the frame and defines a port for receiving a cable. The cable is arranged in the cable securing components.

10 Claims, 2 Drawing Sheets

SYSTEM AND MOUNTING APPARATUS FOR ELECTRONIC DEVICE WITH CABLE SECURING COMPONENTS

BACKGROUND

1. Technical Field

The present disclosure relates to a system and a mounting apparatus for an electronic device with cable securing components for arranging cables of the electronic device.

2. Description of Related Art

Many cables are needed in a server system for transferring signals or providing power. Usually, the cables are not arranged in a well-ordered manner.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
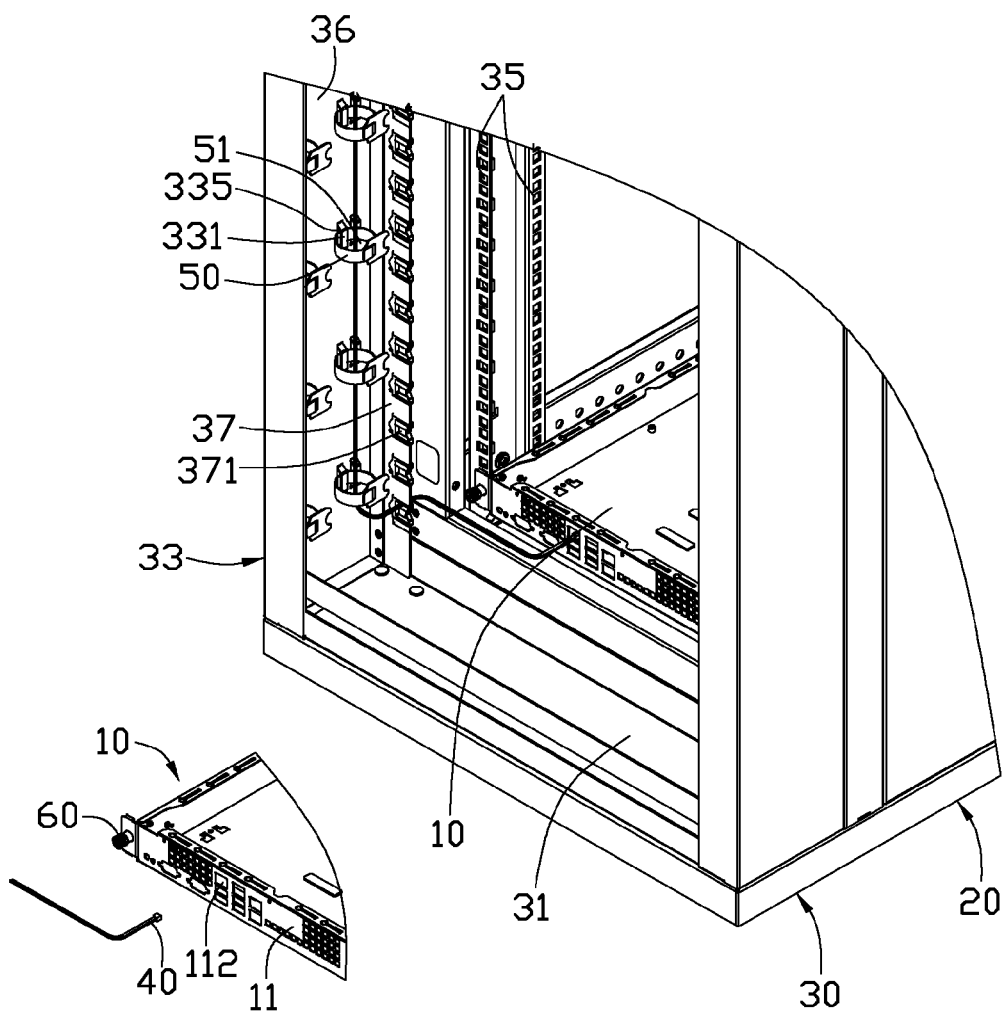
FIG. 1 is a partly exploded, partial view of an electronic device and a mounting rack in accordance with an embodiment.

Referring to FIG. 1, a mounting apparatus in accordance with an embodiment is configured for receiving electronic devices 10. The electronic devices 10 can be inserted into the mounting rack 30 from front to back. Each electronic device 10 includes a front wall 11 located in a front of the electronic device 10. The front wall 11 includes a plurality of ports 112 for receiving ends of cables 40. In an embodiment, the electronic devices 10 may be servers, and the ports 112 may be network ports.

The mounting apparatus comprises a mounting rack 30. In an embodiment, the mounting rack 30 is a server rack. The mounting rack 30 includes a frame 33 and a plurality of supports 35 at the back of the frame 33. The supports 35 are capable of supporting the electronic devices 10, and a plurality of fasteners 60, such as screws, is capable of fixing the electronic devices 10 on the supports 35.

The frame 33 includes a first wall 36 and a second wall 37 substantially perpendicular to the first wall 36. The second wall 37 is adjacent to the supports 35 and defines a plurality of locking openings 371. A plurality of retaining portions 331 is located on the first wall 36. In an embodiment, each retaining portion 331 is bridge-shaped. A gap 335 is defined between each retaining portion 331 and an inner surface of the frame 33. Each retaining portion 331 is capable of engaging with a cable securing component 50. Each cable securing component 50 defines a holding hole 51. In an embodiment, each cable securing component 50 is made of strip of material that is arranged to form a circular holding hole 51. In an embodiment, the cable securing components 50 are vertically arranged.

Figure 2:
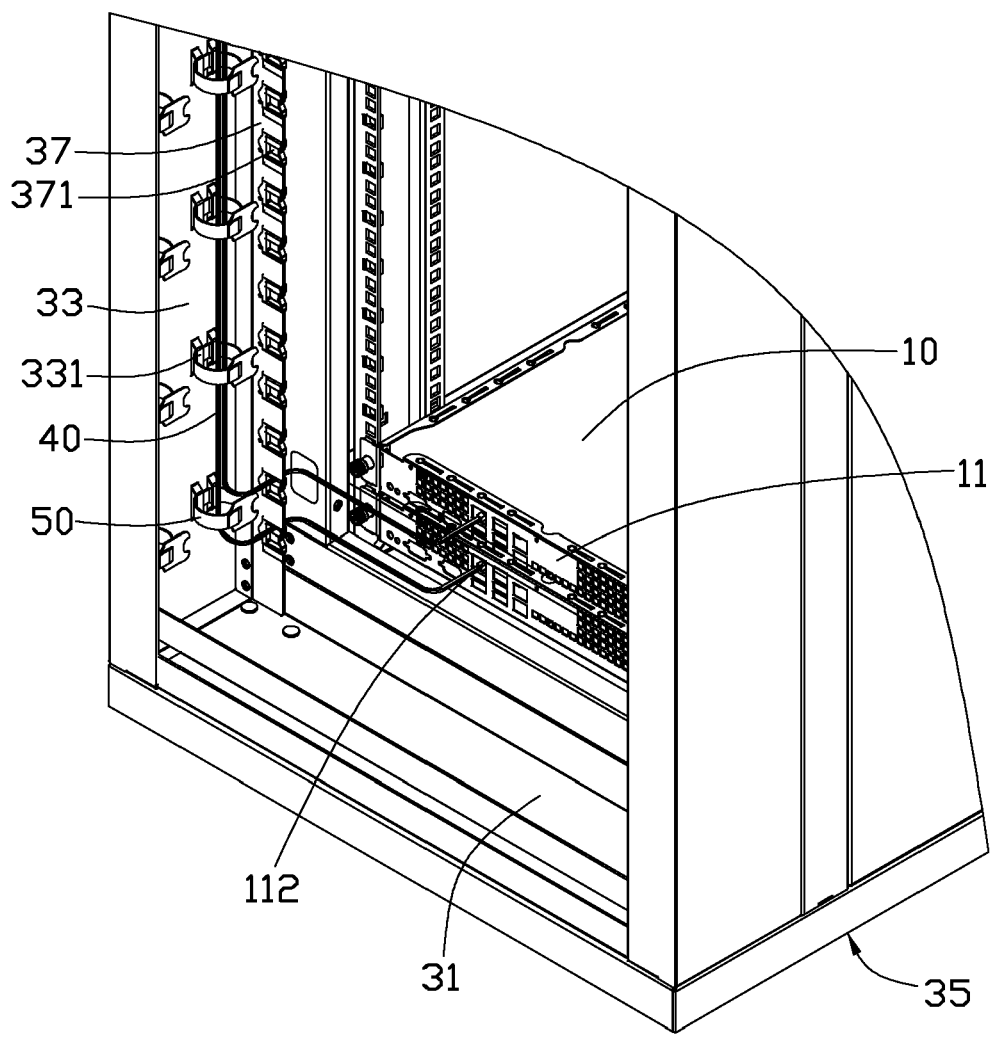
FIG. 2 is an assembled, partial view of the electronic device and the mounting apparatus of FIG. 1.

Referring to FIG. 2, in use, the electronic devices 10 are installed in the mounting rack 30 from front to back and supported by the supports 35. The front wall 11 is adjacent to the frame 33. Ends of the cables 40 are engaged in the ports 112 of the electronic devices 10, and the cables 40 are inserted through the adjacent locking openings 371 and are arranged in the through holes 51 of the cable securing components 50. Therefore, the cables 40 can be arranged in a well-ordered manner.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A system comprising:
   a mounting rack comprising a frame and a plurality of supports located in back of the frame, a plurality of cable securing components is located in the frame;
   an electronic device inserted in the mounting rack from front to back, the electronic device comprises a front wall positioned in front of the electronic device, the front wall is adjacent to the frame and defines a port, the port receives a cable;
   wherein the plurality of cable securing components are located in a vertical direction, and the cable is arranged in the plurality of cable securing components along the vertical direction;
   the frame includes a first wall and a second wall substantially perpendicular to the first wall; and the plurality of cable securing components are located on the first wall;
   the second wall is adjacent to the plurality of supports and defines a plurality of locking openings, and one of the plurality of locking openings receives the cable.

2. The system of claim 1, wherein each cable securing component defines a holding hole that receives the cable.

3. The system of claim 2, wherein each holding hole is circular.

4. The system of claim 1, wherein a plurality of retaining portions are disposed on the frame that secures the plurality of cable securing components to the frame.

5. The system of claim 4, wherein the frame and each of the plurality of retaining portions defines a gap that receives one of the plurality of cable securing components.

6. A mounting apparatus comprising:
   a mounting rack comprising a frame and a plurality of supports located in back of the frame, wherein the plurality of supports are configured for supporting an electronic device, a plurality of cable securing components are located in the frame along a vertical direction; and
   a cable extending from the electronic device, and the cable is tied by the plurality of cable securing components and arranged in the vertical direction;
   the frame includes a first wall and a second wall substantially perpendicular to the first wall; and the plurality of cable securing components are located on the first wall;
   the second wall is adjacent to the plurality of supports and defines a plurality of locking openings, and one of the plurality of locking openings receives the cable.

7. The mounting apparatus of claim 6, wherein each of the plurality of cable securing components defines a holding hole that receives the cable.

8. The mounting apparatus of claim 7, wherein each holding hole is circular.

9. The mounting apparatus of claim 6, wherein a plurality of retaining portions are disposed on the frame that secures the plurality of cable securing components to the frame.

10. The mounting apparatus of claim 9, wherein the frame and each of the plurality of retaining portion defines a gap that receives one of the plurality of cable securing components.

* * * * *